US011417714B2

(12) United States Patent
Lee et al.

(10) Patent No.: US 11,417,714 B2
(45) Date of Patent: Aug. 16, 2022

(54) DISPLAY APPARATUS

(71) Applicant: SAMSUNG DISPLAY CO., LTD., Yongin-si (KR)

(72) Inventors: Junhee Lee, Yongin-si (KR); Injun Bae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 189 days.

(21) Appl. No.: 16/850,338

(22) Filed: Apr. 16, 2020

(65) Prior Publication Data
US 2021/0091151 A1 Mar. 25, 2021

(30) Foreign Application Priority Data
Sep. 20, 2019 (KR) ........................ 10-2019-0116355

(51) Int. Cl.
*H01L 27/32* (2006.01)
(52) U.S. Cl.
CPC ...... *H01L 27/3246* (2013.01); *H01L 27/3216* (2013.01); *H01L 27/3218* (2013.01)
(58) Field of Classification Search
CPC ............. H01L 27/3216; H01L 27/3218; H01L 27/3246
See application file for complete search history.

(56) References Cited

U.S. PATENT DOCUMENTS

| 10,007,968 | B2 | 6/2018 | Jo et al. |
| 10,199,446 | B2 | 2/2019 | Kim et al. |
| 2015/0162391 | A1* | 6/2015 | Kim ...................... H01L 51/525 |
| | | | 257/40 |
| 2018/0061899 | A1 | 3/2018 | Oh et al. |
| 2018/0149932 | A1* | 5/2018 | Nakamura .......... G02F 1/13439 |
| 2018/0183008 | A1* | 6/2018 | Song .................. H01L 51/5271 |
| 2019/0027547 | A1 | 1/2019 | Kim et al. |
| 2019/0140026 | A1* | 5/2019 | Nakanishi ......... G02F 1/133512 |
| 2019/0164510 | A1* | 5/2019 | Fang .................... G09G 3/3611 |
| 2020/0235172 | A1* | 7/2020 | Lee ..................... H01L 51/5088 |
| 2020/0241355 | A1* | 7/2020 | Chang ............... G02F 1/133512 |

FOREIGN PATENT DOCUMENTS

| KR | 1020180013577 A | 2/2018 |
| KR | 1020190009875 A | 1/2019 |

* cited by examiner

*Primary Examiner* — Michael M Trinh
(74) *Attorney, Agent, or Firm* — Cantor Colburn LLP

(57) ABSTRACT

A display apparatus includes a display area and a non-display area, a sub-pixel in the display area, and a pixel-defining layer which defines an area of the sub-pixel. The sub-pixel includes an adjacent sub-pixel arranged in the display area to be adjacent to the non-display area, and an internal sub-pixel arranged in the display area, and the adjacent sub-pixel and the internal sub-pixel implement the same color and have different shapes in a plan view.

17 Claims, 9 Drawing Sheets

DISPLAY APPARATUS

This application claims priority to Korean Patent Application No. 10-2019-0116355, filed on Sep. 20, 2019, and all the benefits accruing therefrom under 35 U.S.C. § 119, the content of which in its entirety is herein incorporated by reference.

BACKGROUND

1. Field

Exemplary embodiments relate to an apparatus, and more particularly, to a display apparatus.

2. Description of Related Art

Mobile electronic devices are being used extensively. As mobile electronic devices, recently, in addition to small electronic devices such as mobile phones, tablet personal computers ("PCs") are being widely used.

Such mobile electronic devices include a display apparatus to provide a user with visual information such as images or videos to thereby support various functions.

Recently, as other parts which drive a display apparatus become smaller, a proportion of the display apparatus in an electronic device is gradually increasing, and display apparatuses having a structure that may be bent at a predetermined angle from a flat state are also being developed.

SUMMARY

When display apparatuses according to the related art are arranged in vehicles, etc., a glare phenomenon may occur in the display apparatuses due to external light reflection, etc. One or more exemplary embodiments include a display apparatus in which the external light reflection is minimized and light blur is removed.

Additional exemplary embodiments will be set forth in part in the description which follows and, in part, will be apparent from the description, or may be learned by practice of the presented exemplary embodiments of the invention.

An exemplary embodiment of a display apparatus includes a display area, a non-display area, a sub-pixel in the display area, and a pixel-defining layer which defines an area of the sub-pixel. The sub-pixel includes an adjacent sub-pixel arranged in the display area to be adjacent to the non-display area, and an internal sub-pixel arranged in the display area, and the adjacent sub-pixel and the internal sub-pixel may implement a same color and have different shapes in a plan view.

In an exemplary embodiment, the pixel-defining layer may be arranged in the display area and the non-display area.

In an exemplary embodiment, the sub-pixel may include a first sub-pixel, a second sub-pixel, and a third sub-pixel, and the first sub-pixel, the second sub-pixel, and the third sub-pixel may emit light of different colors.

In an exemplary embodiment, the first sub-pixel may have a square shape, the second sub-pixel may be arranged to face a first side and a second side of the first sub-pixel, and the third sub-pixel may be arranged to face the first side and the second side of the first sub-pixel and be apart from the second sub-pixel.

In an exemplary embodiment, in the plan view, the first sub-pixel may have a size greater than at least one of a size of the second sub-pixel and a size of the third sub-pixel.

In an exemplary embodiment, the sub-pixel may further include a plurality of first sub-pixels, the plurality of first sub-pixels may be arranged in a first direction, and a long side of the second sub-pixel or a long side of the third sub-pixel may define an angle of about 45 degrees with respect to an arbitrary line connecting centers of the plurality of first sub-pixels arranged in the first direction.

In an exemplary embodiment, the display apparatus may further include a spacer protruding from the pixel-defining layer.

In an exemplary embodiment, the pixel-defining layer may include a black material or a material with an optical density ("OD") of 1.

In an exemplary embodiment, in the plan view, the adjacent sub-pixel may have the same size as a size of the internal sub-pixel.

In an exemplary embodiment, in the plan view, the adjacent sub-pixel may have a same size as a size of the internal sub-pixel, the adjacent sub-pixel and the internal sub-pixel may be respectively arranged to be adjacent to and face a same central sub-pixel, and a shortest distance from a border of the adjacent sub-pixel to a border of the central sub-pixel may be different from a shortest distance from a border of the internal sub-pixel and a border of the central sub-pixel.

An exemplary embodiment of a display apparatus includes a display area, a non-display area, a plurality of sub-pixels in the display area, and a pixel-defining layer in which a plurality of openings defines areas of the plurality of sub-pixels. The plurality of openings is adjacent to the non-display area and include an adjacent opening in the display area and an internal opening in the display area, and the adjacent opening and the internal opening, each defining an area of the plurality of sub-pixels implementing a same color, have different shapes in a plan view.

In an exemplary embodiment, the pixel-defining layer may be arranged in the display area and the non-display area.

In an exemplary embodiment, the plurality of openings may include a first opening, a second opening, and a third opening, the first opening may have a square shape, the second opening may be arranged to face both a first side and a second side of the first opening, and the third opening may be arranged to face both the first side and the second side of the first opening, and be apart from the second opening.

In an exemplary embodiment, the plurality of openings may further include a plurality of first openings, the plurality of first openings may be arranged in a first direction, and a long side of the second opening or a long side of the third opening may define an angle of about 45 degrees with respect to an arbitrary line connecting centers of the plurality of first openings arranged in the first direction.

In an exemplary embodiment, the first opening may have a size greater than at least one of a size of the second opening and a size of the third opening.

In an exemplary embodiment, the pixel-defining layer may include a black material or a material with an OD of 1.

In an exemplary embodiment, the display apparatus may further include a spacer protruding from the pixel-defining layer.

In an exemplary embodiment, in the plan view, the adjacent opening may have a same size as a size of the internal opening.

In an exemplary embodiment, in the plan view, the adjacent opening may have a same size as a size of the internal opening, the adjacent opening and the internal opening may be respectively arranged to be adjacent to and face a same central opening, and a shortest distance from a border of the adjacent opening to a border of the central opening may be different from a shortest distance from a border of the internal opening to a border of the central opening.

BRIEF DESCRIPTION OF THE DRAWINGS

The above and other exemplary embodiments, features, and advantages of the invention will be more apparent from the following description taken in conjunction with the accompanying drawings, in which.

DETAILED DESCRIPTION

Figure 1:
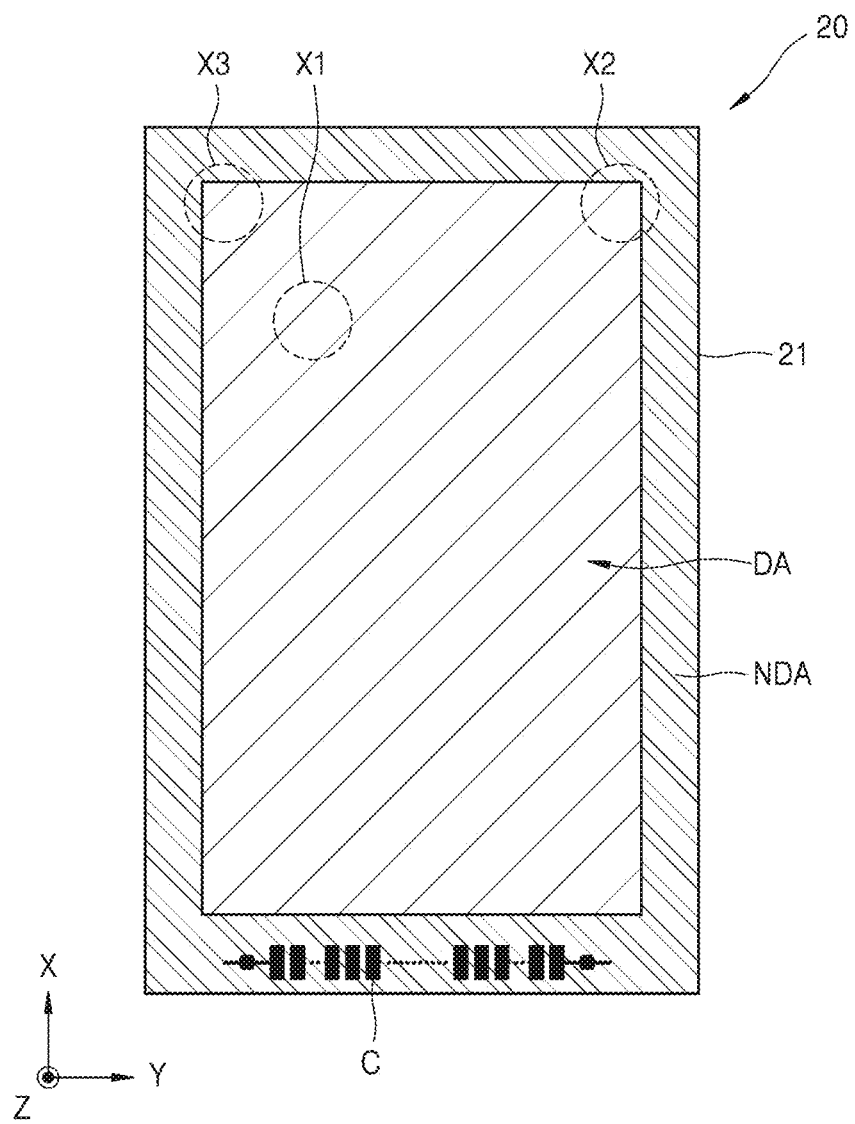
FIG. 1 is a plan view of an exemplary embodiment of a display apparatus.

Reference will now be made in detail to embodiments, examples of which are illustrated in the accompanying drawings, where like reference numerals refer to like elements throughout. In this regard, the exemplary embodiments may have different forms and should not be construed as being limited to the descriptions set forth herein. Accordingly, the exemplary embodiments are merely described below, by referring to the drawing figures, to explain the invention. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will be described in detail with reference to the attached drawings. Like reference numerals in the drawings denote like elements, and thus their descriptions will not be repeated.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "disposed on," another layer, region, or component, it can be directly or indirectly disposed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the invention is not limited thereto.

In the following examples, the X-axis, the Y-axis and the Z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
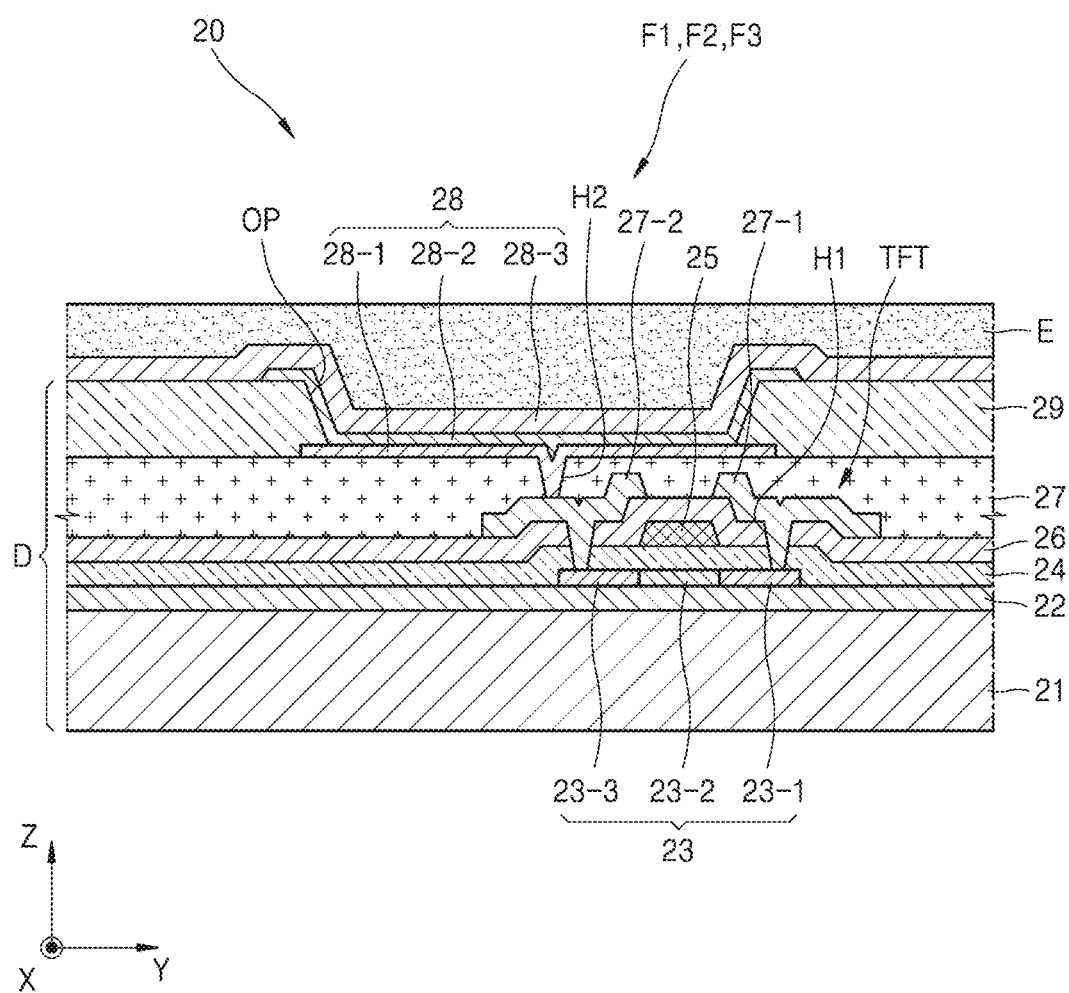
FIG. 2 is a cross-sectional view of a sub-pixel portion of the display apparatus of FIG. 1.
Figure 3:
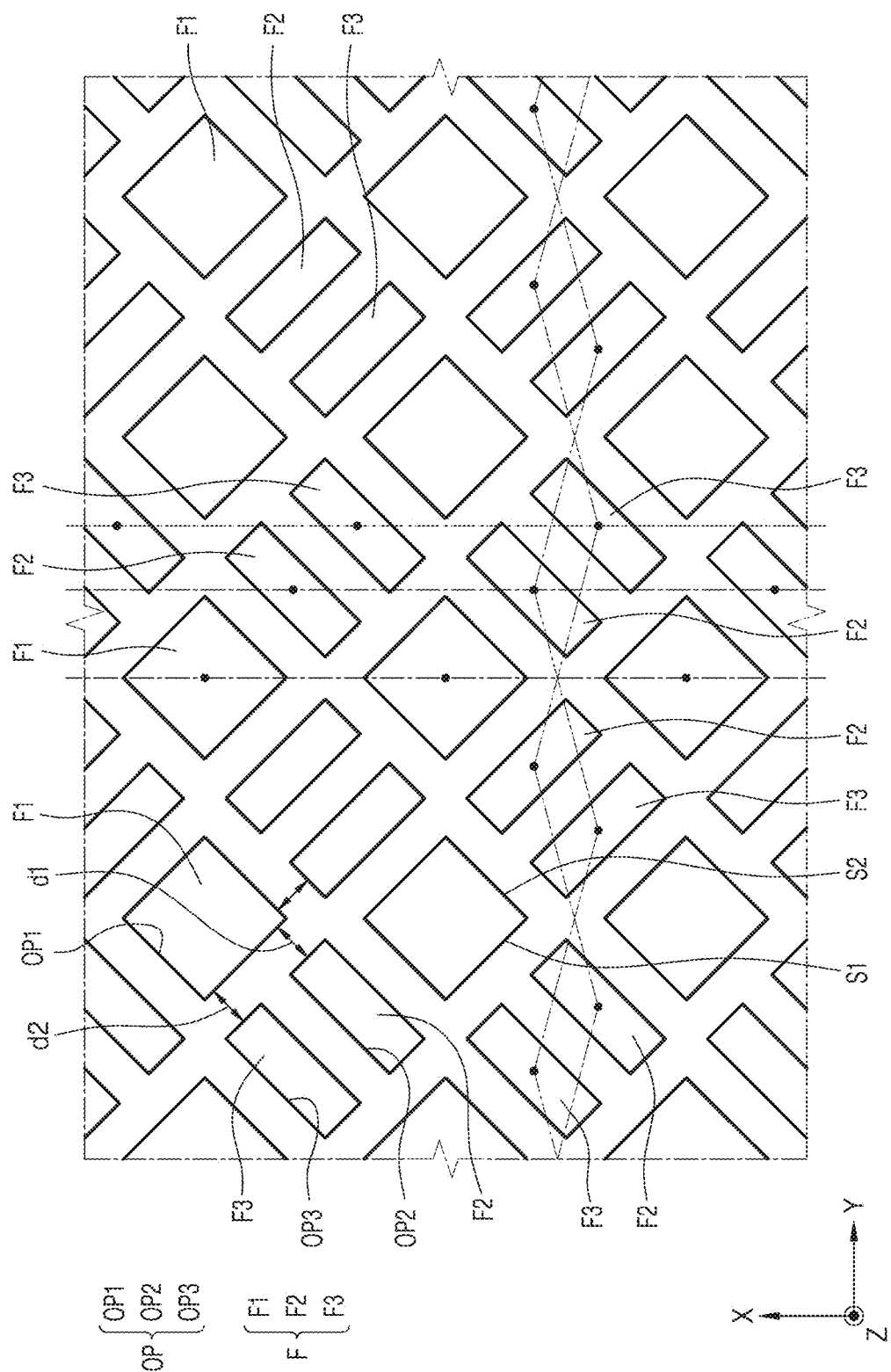
FIG. 3 is a plan view showing portion X1 of FIG. 1 magnified to illustrate a first sub-pixel, a second sub-pixel, and a third pixel of the display apparatus.

FIG. 1 is a plan view of an exemplary embodiment of a display apparatus 20. FIG. 2 is a cross-sectional view of a sub-pixel portion of the display apparatus 20 of FIG. 1. FIG. 3 is a plan view illustrating a first sub-pixel, a second sub-pixel, and a third pixel of the display apparatus 20 by magnifying a portion X1 of FIG. 1.

Referring to FIGS. 1 to 3, on the display apparatus 20, a display area DA and a non-display area NDA outside the display area DA may be defined on a substrate 21. A light emitter portion may be arranged in the display area DA, and a power line (not shown) may be arranged in the non-display area NDA. In addition, a pad portion C may be arranged in the non-display area NDA.

In this case, the display area DA may have various shapes. In an exemplary embodiment, the display area DA may have a shape of a rectangle, a square, a circle, or the like, for example. In addition, the display area DA may have an irregular shape. However, hereinafter, for convenience of description, a case when the display area DA has a rectangular shape is described in detail.

The display apparatus 20 may include a display substrate D and a thin-film encapsulation layer E. The display substrate D may include the substrate 21, a thin-film transistor TFT, a passivation layer 27, and a pixel electrode 28-1. In another exemplary embodiment, the display substrate D may include some of the substrate 21, the thin-film transistor TFT, the passivation layer 27, the pixel electrode 28-1, and an intermediate layer 28-2.

In an exemplary embodiment, the substrate 21 may include a plastic material or a metal material such as stainless steel ("SUS") or titanium (Ti). In addition, the substrate 21 may include polyimide. Hereinafter, for convenience of description, a case when the substrate 21 includes polyimide is described in detail.

The thin-film transistor TFT may be arranged on the substrate 21, and the passivation layer 27 is arranged to cover the thin-film transistor TFT. An organic light-emitting diode ("OLED") 28 may be arranged on the passivation layer 27.

A buffer layer 22 including an organic compound and/or an inorganic compound may be further arranged on an upper surface of the substrate 21. In an exemplary embodiment, the buffer layer 22 may include $SiO_x$ ($x \geq 1$) or $SiN_x$ ($x \geq 1$), for example.

An active layer 23 arranged in a predetermined pattern is provided on the buffer layer 22. Then, the active layer 23 is buried in a gate insulating layer 24. The active layer 23 includes a source area 23-1, a drain area 23-3, and a channel area 23-2 therebetween.

The active layer 23 may be provided to include various materials. In an exemplary embodiment, the active layer 23 may include an inorganic semiconductor material such as amorphous silicon or crystalline silicon, for example. In another exemplary embodiment, the active layer 23 may include an oxide semiconductor. In another exemplary embodiment, the active layer 23 may include an organic semiconductor material However, hereinafter, for convenience of description, a case when the active layer 23 includes amorphous silicon is described in detail.

The active layer 23 may be provided by forming an amorphous silicon layer on the buffer layer 22, crystallizing the amorphous silicon layer to thereby form a polycrystalline silicon layer, and then, patterning the polycrystalline silicon layer. According to a type of the thin-film transistor TFT such as a driving thin-film transistor (not shown), a switching thin-film transistor, etc., the source area 23-1 and the drain area 23-3 in the active layer 23 are doped with an impurity.

On an upper surface of the gate insulating layer 24, a gate electrode 25 corresponding to the active layer 23 and an interlayer insulating layer 26 in which the gate electrode 25 is buried are arranged.

In addition, a contact hole H1 may be defined in the interlayer insulating layer 26 and the gate insulating layer 24. A source electrode 27-1 and a drain electrode 27-2 may be arranged on the interlayer insulating layer 26 to be in contact with the source area 23-1 and the drain area 23-3, respectively.

The passivation layer 27 may be arranged on an upper part of the thin-film transistor TFT, and the pixel electrode 28-1 of the OLED 28 may be arranged on the passivation layer 27. The pixel electrode 28-1 is in contact with the drain electrode 27-2 of the thin-film transistor TFT via a hole H2 in the passivation layer 27. The passivation layer 27 may include a single layer or two or more layers including an inorganic material and/or an organic material. The passivation layer 27 may include a planarization layer to have a flat upper surface regardless of a curve of a layer therebelow. In an alternative exemplary embodiment, the passivation layer 27 may be provided to be curved according to a curve of the layer therebelow. In addition, the passivation layer 27 may include a transparent insulating body to obtain a resonance effect.

A pixel-defining layer 29 is arranged to cover the pixel electrode 28-1 and the passivation layer 27 and includes an organic and/or inorganic material, and an opening OP to expose the pixel electrode 28-1 is defined in the pixel-defining layer 29. In some exemplary embodiments, the pixel-defining layer 29 may include a black material or a material with an optical density ("OD") of 1. The pixel-defining layer 29 including the black material or the material with an OD of 1 may reduce external light reflection of the display apparatus 20.

In addition, the intermediate layer 28-2 and an opposite electrode 28-3 are arranged at least on the pixel electrode 28-1. In another exemplary embodiment, the opposite electrode 28-3 may be arranged on an entire surface of the display area DA. In this case, the opposite electrode 28-3 may be arranged on the intermediate layer 28-2 and the pixel-defining layer 29. Hereinafter, for convenience of description, a case when the opposite electrode 28-3 is arranged on the intermediate layer 28-2 and the pixel-defining layer 29 is described in detail.

The pixel electrode 28-1 functions as an anode electrode. The opposite electrode 28-3 functions as a cathode electrode. However, polarities of the pixel electrode 28-1 and the opposite electrode 28-3 are not limited thereto, and may be opposite in another exemplary embodiment.

The pixel electrode 28-1 and the opposite electrode 28-3 are insulated from each other by the intermediate layer 28-2, and apply voltages of different polarities to the intermediate layer 28-2 so that an organic emission layer emits light.

The intermediate layer 28-2 may include the organic emission layer. As another selective example, the intermediate layer 28-2 may include an organic emission layer and, in addition to this, further include at least one of a hole injection layer ("HIL"), a hole transport layer, an electron transport layer, and an electron injection layer. However, the invention is not limited thereto. The intermediate layer 28-2 may include the organic emission layer and further include various functional layers (not shown).

A plurality of intermediate layers 28-2 may be provided, and the plurality of intermediate layers 28-2 may form the display area DA. In this case, the plurality of intermediate layer 28-2 may be arranged in the display area DA to be apart from each other.

A unit pixel may include a plurality of sub-pixels. The plurality of sub-pixels may emit light of various colors. In an exemplary embodiment, a sub-pixel may be defined as an area in which light of a color is emitted. In another exemplary embodiment, a sub-pixel may be defined as a portion of the pixel electrode 28-1 exposed to outside via an opening OP in the pixel-defining layer 29. In this case, adjustment of a size of the sub-pixel may be achieved by adjusting a size of the portion of the pixel electrode 28-1 exposed to outside by adjusting a size of the opening OP in the pixel-defining layer 29. However, hereinafter, for convenience of description, a case when a sub-pixel is an area in which light of a color is emitted is described in detail.

The plurality of sub-pixels described above may respectively include sub-pixels emitting red, green, and blue light, for example. In another exemplary embodiment, a plurality of sub-pixels may include sub-pixels emitting red, green, blue, and white light, for example. In another exemplary embodiment, a plurality of sub-pixels may include sub-pixels emitting red, yellow, and blue light, for example. In this case, the plurality of sub-pixels is not limited thereto. All cases in which sub-pixels emitting light of different colors are provided may be included. However, hereinafter, for convenience of description, a case when a plurality of sub-pixels includes sub-pixels emitting blue, red, and green light is described in detail.

The plurality of sub-pixels F may include a first sub-pixel F1, a second sub-pixel F2, and a third sub-pixel F3. In this case, one of the first sub-pixel F1, the second sub-pixel F2, and the third sub-pixel F3 may have a square shape, and other two of the first sub-pixel F1, the second sub-pixel F2, and the third sub-pixel F3 may have a rectangular shape. Hereinafter, for convenience of description, a case when the first sub-pixel F1 has a square shape and the second sub-pixel F2 and the third sub-pixel F3 have rectangular shapes is described in detail.

One of the first sub-pixel F1, the second sub-pixel F2, and the third sub-pixel F3, described above, emits blue light. Another one of the first sub-pixel F1, the second sub-pixel F2, and the third sub-pixel F3 emits green light. The other one of the first sub-pixel F1, the second sub-pixel F2, and the third sub-pixel F3 may emits red light. In this case, according to respective shapes of the first sub-pixel F1, the second sub-pixel F2, and the third sub-pixel F3, one of blue light, green light, and red light may have a square shape, and the others of the blue light, the green light, and the red light may have a rectangular shape. Hereinafter, for convenience of description, a case when the first sub-pixel F1 emits blue light, the second sub-pixel F2 emits green light, and the third sub-pixel F3 emits red light is described in detail.

Sizes of the first sub-pixel F1, the second sub-pixel F2, and the third sub-pixel F3 may be variously configured. In this case, since an aperture ratio of each of the sub-pixels may be adjusted, the display apparatus 20 having various forms and performing various operations may be implemented.

A plurality of first sub-pixels F1, a plurality of second sub-pixels F2, and a plurality of third sub-pixels F3 may be respectively provided. The plurality of first sub-pixels F1 may be arranged to be apart from each other in at least one direction of a first direction and a second direction. In an exemplary embodiment, some of the plurality of first sub-pixels F1 may be arranged in the first direction (e.g., one of an X-axis direction or a Y-axis direction in FIG. 3) to be apart from each other, and others of the plurality of first sub-pixels F1 may be arranged in the second direction (e.g., the other one of the X-axis direction or the Y-axis direction in FIG. 3) to be apart from each other, for example. In this case, centers of the first sub-pixels F1 arranged in the first direction, among the plurality of first sub-pixels F1, may be arranged in a line, and the line may be arranged in a direction parallel to the first direction. In addition, centers of the other first sub-pixels F1 arranged in the second direction, among the plurality of first sub-pixels F1, may be arranged in a line, and the line may be arranged in a direction parallel to the second direction.

A first side S1 of each of the first sub-pixels F1 may define a predetermined angle with a second side S2 that is another side of each of the first sub-pixels F1. Particularly, the first side S1 and the second side S2 of each of the first sub-pixels F1 may define a right angle. In this case, the first side S1 and the second S2 may each be arranged to be tilted in different directions with respect to at least one of the first direction and the second direction. Accordingly, each of the first sub-pixels F1 may be arranged in a diamond shape with reference to one of the first direction and the second direction. In addition, an angle defined by two sides including the first side S1 and the second side S2 adjacent to each apex of the first sub-pixels F1 may be about 90 degrees.

In this case, a second sub-pixel F2 and a third sub-pixel F3 may be arranged to face the first sub-pixel F1 on the first side S1 or the second side S2 of first sub-pixel F1. In this case, the second sub-pixel F2 and the third sub-pixel F3 may be arranged to be tilted against one of the first direction or the second direction. Particularly, the second sub-pixel F2 and the third sub-pixel F3 may be tilted to define an angle of about 45 degrees with respect to one of the first direction or the second direction. In an exemplary embodiment, at least one of a short side and a long side of at least one of the second sub-pixels F2 and the third sub-pixels F3 may define an angle of about 45 degrees with respect to a line connecting centers of the plurality of first sub-pixels F1 arranged in the first direction, for example.

The second sub-pixel F2 and the third sub-pixel F3 may have a rectangular form. In this case, a size of the at least one of the second sub-pixel F2 and the third sub-pixel F3 may be less than a size of the first sub-pixel F1. In addition, at least one of a second sub-pixel F2 and a third sub-pixel F3 facing a first sub-pixel F1 may be arranged to overlap a side of the first sub-pixel F1 facing the second sub-pixel F2 and the third sub-pixel F3 (e.g., the first side S1 or the second side S2) or an extension line of the side of the first sub-pixel F1. That is, at least a portion of the second sub-pixel F2 and at least a portion of the third sub-pixel F3 adjacent to each other may be arranged within a range of a length of one of the first side S1 or the second side S2. A short side or a long side of at least one of the second sub-pixel F2 and the third sub-pixel F3 facing a first sub-pixel F1 may be arranged in parallel with the first side S1 or the second side S2.

In an exemplary embodiment, extension lines of short sides of different second sub-pixels F2 facing the first side S1 and the second side S2, respectively, may cross each other, or extension lines of long sides of different second sub-pixels F2 facing the first side S1 and the second side S2, respectively, may cross each other, for example. In another exemplary embodiment, extension lines of short sides of respective third sub-pixels F3 facing the first side S1 and the second side S2, respectively, may cross each other, or extension lines of long sides of respective third sub-pixels F3 facing the first side S1 and the second side S2, respectively, may cross each other. In another exemplary embodiment, an extension line of a short side of the second sub-pixel F2 facing the first side S1 may cross an extension line of a short side of the third sub-pixel F3 facing the second side S2. In an alternative exemplary embodiment, an extension line of a long side of the second sub-pixel F2 facing the first side S1 may cross an extension line of a long side of the third sub-pixel F3 facing the second side S2. In another exemplary embodiment, an extension line of a long side of the second sub-pixel F2 facing the first side S1 may cross an extension line of a short side of the third sub-pixel F3 facing the second side S2. In an alternative exemplary embodiment, an extension line of a short side of the second sub-pixel F2 facing the first side S1 may cross an extension line of a long side of the third sub-pixel F3 facing the second side S2.

The plurality of second sub-pixels F2 described above may be arranged to be apart from each other in at least one direction of the first direction and the second direction. In an exemplary embodiment, centers of some of the plurality of second sub-pixels F2 arranged in the first direction or the second direction may be arranged in a line. In another exemplary embodiment, centers of some of the plurality of second sub-pixels F2 arranged in one direction of the first direction or the second direction may be arranged in a line. In addition, centers of others of the plurality of second sub-pixels F2 arranged in the other direction of the first direction and the second direction may be arranged in a serpentine or zigzag form in the other direction of the first direction and the second direction. Hereinafter, for convenience of description, a case when centers of some of the plurality of second sub-pixels F2 arranged in the first direction are arranged in a line, and centers of others of the plurality of second sub-pixels F2 arranged in the second direction are arranged in a serpentine form is described in detail.

Similarly to the second sub-pixels F2, the plurality of third sub-pixels F3 may also be arranged to be apart from each other in at least one of the first direction and the second direction. In this case, the plurality of third sub-pixels F3 may be arranged similarly to the plurality of second sub-pixels F2. Hereinafter, for convenience of description, a case when, among the plurality of third sub-pixels F3, centers of some of third sub-pixels F3 arranged in the first direction are arranged in a line and, among the plurality of third pixels F3, centers of others of third sub-pixels F3 arranged in the second direction are arranged in a serpentine form is described in detail.

In this case, one of a second sub-pixel F2 and a third sub-pixel F3 facing the first side S1 of a first sub-pixel F1 may be arranged to be symmetrical to one of a second sub-pixel F2 or a third sub-pixel F3 facing the second side S2 of the first sub-pixel F1 with reference to a line connecting centers of first sub-pixels F1 arranged in the first direction to each other (or an arbitrary line passing through centers of two adjacent sub-pixels and being in parallel with the first direction). In an exemplary embodiment, a second sub-pixel F2 facing the first side S1 may be symmetrical to a third sub-pixel F3 facing the second side S2 with reference to the line described above. In addition, a third sub-pixel F3 facing the first side S1 may be symmetrical to a second sub-pixel F2 facing the second side S2 with reference to the line described above, for example. In this case, a distance between centers of adjacent second sub-pixels F2 may be identical to a distance between centers of adjacent third sub-pixels F3. In another exemplary embodiment, a second sub-pixel F2 and a third sub-pixel F3, each facing the first side S1, may be symmetrical to a second sub-pixel F2 and a third sub-pixel F3, each facing the second side S2, respectively, with reference to the line described above. In this case, a distance between centers of a pair of sub-pixels of a pair of second sub-pixels F2 or a pair of third sub-pixels F3 may be less than a distance between centers of the other pair of sub-pixels of the pair of second sub-pixels F2 and the pair of third sub-pixels F3, where the pair of second sub-pixels F2 is arranged symmetrical to each other and the pair of third sub-pixels F3 is arranged symmetrical to each other. In this case, a pair of adjacent second sub-pixels F2 may be arranged between a pair of adjacent third sub-pixels F3. In an alternative exemplary embodiment, a pair of adjacent third sub-pixels F3 may be arranged between a pair of adjacent second sub-pixels F2, for example. However, for convenience of description, a case when a second sub-pixel F2 is arranged symmetrical to a third sub-pixel F3 with reference to a line connecting centers of first sub-pixels F1 arranged in the first direction is described in detail.

In a case of the arrangement described above, a first distance d1 that is a shortest distance from a border of a first sub-pixel F1 to the second sub-pixel F2 may be identical to a second distance d2 that is a shortest distance between a border of the first sub-pixel F1 to the third sub-pixel F3. In this case, a shortest distance may be measured from the first side S1 or the second side S2 to a side of the second sub-pixel F2 or a side of the third sub-pixel F3 in a direction perpendicular to one of the first side S1 or the second side S2. In an alternative exemplary embodiment, a shortest distance may be measured from the first side S1 or the second side S2 to a side of the second sub-pixel F2 or a side of the third sub-pixel F3 in a direction perpendicular to an extension line of one of the first side S1 or the second side S2. However, for convenience of description, a case when a shortest distance is a distance measured at the first side S1 or an extension line of the first S1 with respect to the second sub-pixel F2 or the third sub-pixel F3 facing the first side S1 is described in detail. In another exemplary embodiment other than the case described above, a distance from a center of a first sub-pixel F1 to a center of a second sub-pixel F2 or a distance from a center of the first sub-pixel F1 to a center of a third sub-pixel F3 may be measured as a shortest distance. In another exemplary embodiment, a distance from the first side S1 of a first sub-pixel F1 or an extension line of the first side S1 to a center of a second sub-pixel F2 or a center of a third sub-pixel F3 may be measured as a shortest distance.

In an exemplary embodiment, an organic layer of the thin-film encapsulation layer E may include polyethylene terephthalate, polyethylene naphthalate, polycarbonate, polyimide, polyethylene sulfonate, polyoxymethylene, polyarylate, hexamethyldisiloxane, acrylic-based resin (e.g., polymethyl methacrylate, polyacrylic acid, etc.) or an arbitrary combination thereof, for example.

An inorganic layer of the thin-film encapsulation layer E may include a single layer or a layer stack including metal oxide or metal nitride. In an exemplary embodiment, the inorganic layer may include at least one of silicon nitride ($SiN_x$), aluminum oxide ($Al_2O_3$), silicon oxide ($SiO_2$), and titanium oxide ($TiO_2$), for example.

A top layer of the thin-film encapsulation layer E exposed to outside may include an inorganic layer to prevent intrusion of moisture into an OLED.

The thin-film encapsulation layer E may include at least one sandwich structure in which at least one organic layer is inserted between at least two inorganic layers. In another exemplary embodiment, the thin-film encapsulation layer E may include at least one sandwich structure in which at least one inorganic layer is inserted between at least two organic layers. In another exemplary embodiment, the thin-film encapsulation layer E may include a sandwich structure in which at least one organic layer is inserted between at least two inorganic layers and a sandwich structure in which at least one inorganic layer is inserted between at least two organic layers.

The thin-film encapsulation layer E may sequentially include a first inorganic layer, a first organic layer, and a second inorganic layer from a top of the OLED.

In another exemplary embodiment, the thin-film encapsulation layer E may sequentially include a first inorganic layer, a first organic layer, a second inorganic layer, a second organic layer, and a third inorganic layer from a top of the OLED.

In another exemplary embodiment, the thin-film encapsulation layer E may sequentially include a first inorganic layer, a first organic layer, a second inorganic layer, a second organic layer, a third inorganic layer, a third organic layer, and a fourth inorganic layer from a top of the OLED.

A halogenized metal layer including lithium-fluoride (LiF) may be additionally included between the OLED and the first inorganic layer. The halogenized metal layer may prevent the OLED from being damaged when the first inorganic layer is provided in a sputtering method.

The first organic layer may have a size less than that of the second inorganic layer, and the second organic layer may have a size less than that of the third inorganic layer.

As described above, when a plurality of inorganic layers is included, the inorganic layers may be deposited to be in direct contact with each other at a border area of the display apparatus 20, and an organic layer may not be exposed to outside.

The display apparatus 20 described above may be fixed to an apparatus moving a user, such as a vehicle, etc. In this case, the display apparatus 20 may be fixed to the apparatus to define a predetermined angle of more than 0 degree between the gaze direction from the user's eye with respect to the first direction or the second direction. In an exemplary embodiment, the display apparatus 20 may be arranged to define an angle of about 90 degrees between the direction of gaze from the user's eye toward the display apparatus 20 and the first direction or the second direction, for example. Hereinafter, for convenience of description, a case in which an angle of about 90 degrees is defined between the gaze direction toward the display apparatus 20 and the first direction is described in detail.

In the above-described case, when the user views the display apparatus 20, since an inclined portion of the pixel-defining layer 29 is not perpendicular to the viewing direction, external light may be prevented from being reflected onto the inclined portion of the pixel-defining layer 20, and thus, incident on the user's eye.

Figure 4A:
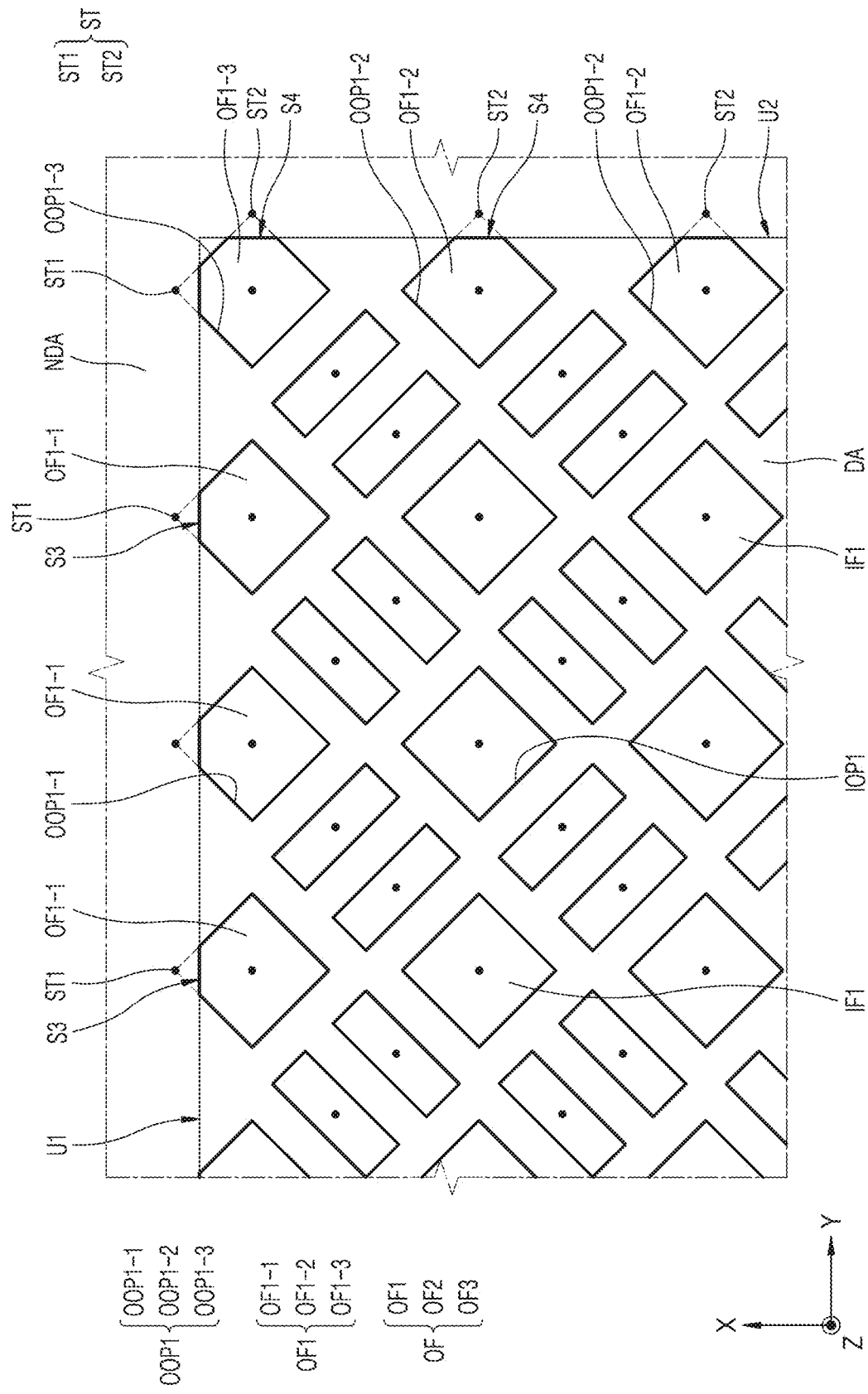
FIG. 4A is a magnified view of portion X2 of FIG. 1.
Figure 4B:
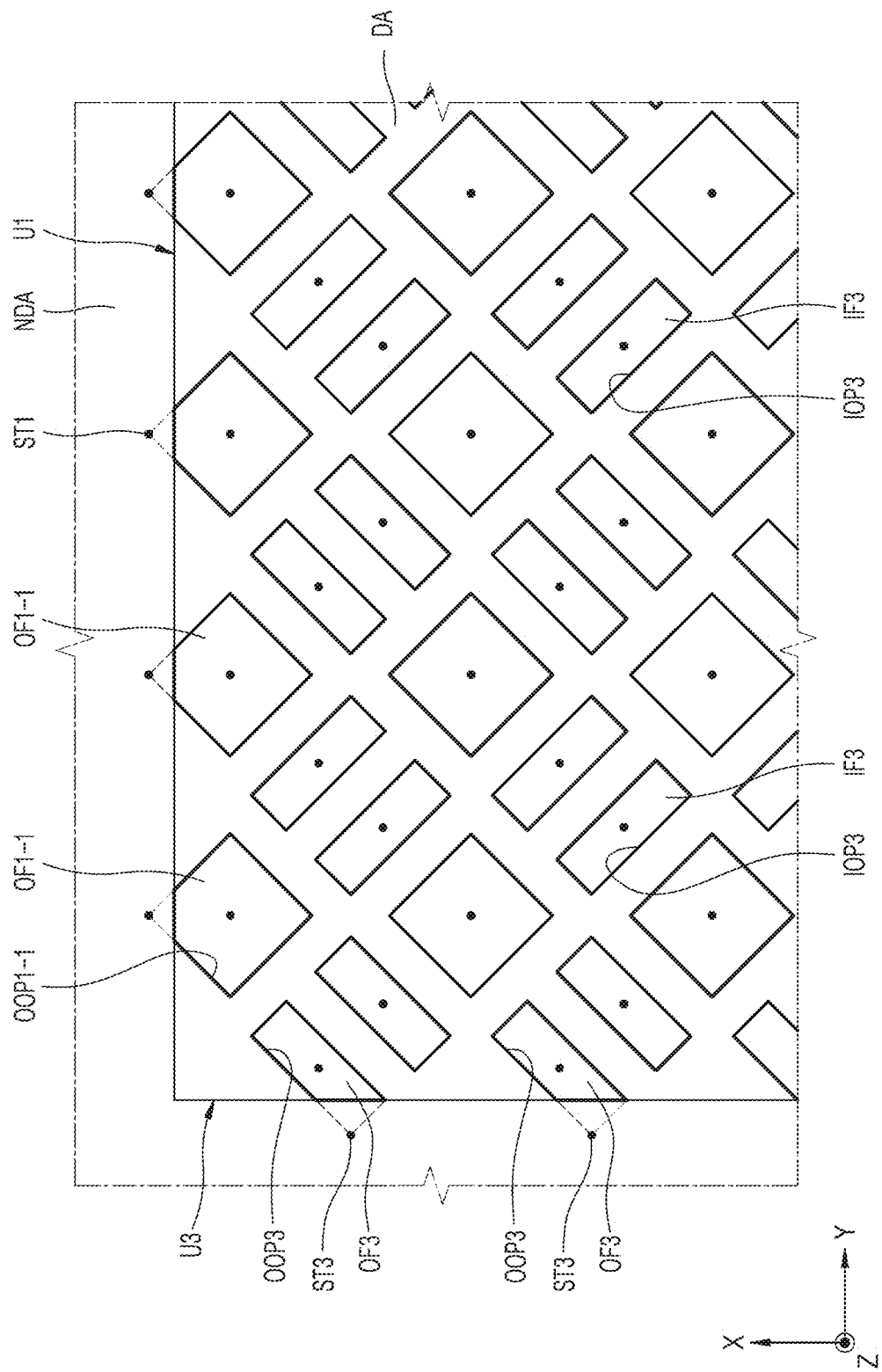
FIG. 4B is a magnified view of portion X3 of FIG. 1.

FIG. 4A is a magnified view of a portion X2 of FIG. 1. FIG. 4B is a magnified view of a portion X3 of FIG. 1.

Referring to FIGS. 4A and 4B, the first sub-pixel F1 may include a first adjacent sub-pixel OF1 and a first internal sub-pixel IF1. The first adjacent sub-pixel OF1 may have a shape different from that of the first internal sub-pixel IF1 in a plan view.

In an exemplary embodiment, the first adjacent sub-pixel OF1 and the first internal sub-pixel IF1 may be arranged in the display area DA. The first adjacent sub-pixel OF1 may be arranged in the display area DA to be adjacent to the non-display area NDA. In another exemplary embodiment, the first adjacent sub-pixel OF1 may be arranged in the display area DA adjacent to a boundary between the non-display area NDA and the display area DA. In another exemplary embodiment, the first adjacent sub-pixel OF1 may be arranged in the display area DA to be adjacent to a border of the display area DA. Hereinafter, for convenience of description, a case when the first adjacent sub-pixel OF1 is arranged in the display area DA to be adjacent to the non-display area NDA is described in detail.

The first adjacent sub-pixel OF1 may have a polygonal shape. In an exemplary embodiment, the first adjacent sub-pixel OF1 may have a pentagonal shape. In another exemplary embodiment, one of apexes ST of the first adjacent sub-pixel OF1 may be chamfered to form a pentagon. In another exemplary embodiment, the first adjacent sub-pixel OF1 may have a hexagonal shape. However, as described above, a shape of the first adjacent sub-pixel OF1 is not limited to a pentagon or a hexagon.

The first adjacent sub-pixel OF1 may include a first upper sub-pixel OF1-1, a first right sub-pixel OF1-2, and a first crossing sub-pixel OF1-3.

The first upper sub-pixel OF1-1 may include an edge parallel with a border of the display area DA. In an exemplary embodiment, the first upper sub-pixel OF1-1 may include an edge S3 parallel with the second direction. In another exemplary embodiment, the first upper sub-pixel OF1-1 may include the edge S3 parallel with an upper border U1 of the display area DA. Hereinafter, for convenience of description, a case when the first upper sub-pixel OF1-1 includes the edge S3 parallel with the upper border U1 of the display area DA is described in detail.

A chamfered apex among apexes of the first upper sub-pixel OF1-1 may be a portion overlapping the non-display area NDA. In an exemplary embodiment, when the first upper sub-pixel OF1-1 is arranged adjacent to the upper border U1 of the display area DA, a first apex ST1 chamfered among the apexes of the first upper sub-pixel OF1-1 may be a portion overlapping the non-display area NDA, for example.

A plurality of first upper sub-pixels OF1-1 may be arranged to be adjacent to the non-display area NDA and apart from each other. In an exemplary embodiment, the first upper sub-pixels OF1-1 may be arranged to be parallel with the upper border U1 of the display area DA and apart from each other, for example. In another exemplary embodiment, the first upper sub-pixels OF1-1 may be arranged to be adjacent to the non-display area NDA, parallel with the second direction, and apart from each other.

Similarly to the first upper sub-pixel OF1-1, the first right sub-pixel OF1-2 may include an edge parallel with a border of the display area DA. Particularly, the first right sub-pixel OF1-2 may include an edge S4 parallel with a right border U2 of the display area DA. A chamfered apex among apexes of the first right sub-pixel OF1-2 may be a portion overlapping the non-display area NDA. A second apex ST2 chamfered among the apexes of the first right sub-pixel OF1-2 may be a portion overlapping the non-display area NDA. A plurality of first right sub-pixels OF1-2 may be arranged to be adjacent to the non-display area NDA and apart from each other. Particularly, the first right sub-pixels OF1-2 may be arranged to be adjacent to the non-display area NDA, parallel with the right border U2 of the display area DA, and apart from each other.

In an exemplary embodiment, the display apparatus 20 may include the first crossing sub-pixel OF1-3. The first crossing sub-pixel OF1-3 may include at least two edges parallel with a border of the display area DA. In an exemplary embodiment, the first crossing sub-pixel OF1-3 may include an edge parallel with the second direction and an edge parallel with the first direction, for example. In another exemplary embodiment, the first crossing sub-pixel OF1-3 may include the edge S3 parallel with the upper border U1 of the display area DA and the edge S4 parallel with the right border U2 of the display area DA.

The first internal sub-pixel IF1 may be arranged in the display area DA. In an exemplary embodiment, the first internal sub-pixel IF1 may not be the first adjacent sub-pixel OF1, but a first sub-pixel F1. In another exemplary embodiment, the first adjacent sub-pixel OF1 may be arranged to surround the first internal sub-pixel IF1.

As described above, the pixel-defining layer 29 may define areas of the sub-pixels described above. In an exemplary embodiment, the pixel-defining layer 29 may be arranged in the display area DA and the non-display area NDA. In an exemplary embodiment, the pixel-defining layer 29 may define areas of the first adjacent sub-pixel OF1 and the first internal sub-pixel IF1, for example. Since the first adjacent sub-pixel OF1 is arranged to be adjacent to the non-display area NDA, the pixel-defining layer 29 may be arranged in the non-display area NDA to define an area of the first adjacent sub-pixel OF1.

The first adjacent sub-pixel OF1 and the first internal sub-pixel IF1 implementing a same color may have different shapes in a plan view. Particularly, the first upper sub-pixel OF1-1, the first right sub-pixel OF1-2, and the first crossing sub-pixel OF1-3 may have different shapes from a shape of the first internal sub-pixel IF1 in a plan view. In an exemplary embodiment, the first upper sub-pixel OF1-1 and the first right sub-pixel OF1-2 may have pentagonal shapes in a plan view, for example. Since the first internal sub-pixel IF1 may have a square shape in a plan view, the first upper sub-pixel OF1-1, the first right sub-pixel OF1-2, and the first internal sub-pixel IF1 may have different shapes in a plan view. In another exemplary embodiment, the first crossing sub-pixel OF1-3 may have a hexagonal shape in a plan view. Since the first internal sub-pixel IF1 may have a square shape in a plan view, the first internal sub-pixel IF1 may have a shape different from a shape of the first crossing sub-pixel OF1-3 in a plan view.

Although not illustrated in the drawing, similarly to the first sub-pixel F1, the second sub-pixel F2 may include a second adjacent sub-pixel and a second internal sub-pixel. Similarly to the first adjacent sub-pixel OF1, the second adjacent sub-pixel may be arranged in the display area DA to be adjacent to the non-display area NDA. Similarly to the first upper sub-pixel OF1-1, the second adjacent sub-pixel may include an edge parallel with a lower border of the display area DA. A plurality of second adjacent sub-pixels may be arranged to be adjacent to the non-display area NDA and apart from each other. Similarly to the first internal sub-pixel IF1, the second internal sub-pixel may be arranged in the display area DA.

Similarly to the first sub-pixel F1 or the second sub-pixel F2, the third sub-pixel F3 may include a third adjacent sub-pixel OF3 and a third internal sub-pixel IF3. Similarly to the first adjacent sub-pixel OF1, the third adjacent sub-pixel OF3 may be arranged in the display area DA to be adjacent to the non-display area NDA. Similarly to the first right sub-pixel OF1-2, the third adjacent sub-pixel OF3 may include an edge parallel with a left border U3 or a lower border of the display area DA. A third apex ST3 chamfered among apexes of the third adjacent sub-pixel OF3 may be a portion overlapping the non-display area NDA. A plurality of third adjacent sub-pixels OF3 may be arranged to be adjacent to the non-display area NDA and apart from each other. Similarly to the first internal sub-pixel IF1, the third internal sub-pixel IF3 may be arranged in the display area DA.

From another perspective, a first opening OP1 may be arranged in the display area DA to correspond to the first sub-pixel F1. The first opening OP1 may include a first adjacent opening OOP1 and a first internal opening IOP1. The first adjacent opening OOP1 and the first internal opening IOP1 may have different shapes in a plan view.

In an exemplary embodiment, the first adjacent opening OOP1 and the first internal opening IOP1 may be arranged in the display area DA. The first adjacent opening OOP1 may be arranged in the display area DA to be adjacent to the non-display area NDA. In another exemplary embodiment, the first adjacent opening OOP1 may be arranged in the display area DA adjacent to a boundary between the non-display area NDA and the display area DA. In another exemplary embodiment, the first adjacent opening OOP1 may be arranged in the display area DA to be adjacent to a border of the display area DA. Hereinafter, for convenience of description, a case when the first adjacent opening OOP1 is arranged in the display area DA to be adjacent to the non-display area NDA is described in detail.

The first adjacent opening OOP1 may have a polygonal shape. In an exemplary embodiment, the first adjacent opening OOP1 may have a pentagonal shape. In another exemplary embodiment, the first adjacent opening OOP1 may have a hexagonal shape. However, as described above, a shape of the first adjacent opening OOP1 is not limited to a pentagon or a hexagon.

The first adjacent opening OOP1 may include a first upper opening OOP1-1, a first right opening OOP1-2, and a first crossing opening OOP1-3.

The first upper opening OOP1-1 may include an edge parallel with a border of the display area DA. In an exemplary embodiment, the first upper opening OOP1-1 may include the edge S3 parallel with the second direction. In another exemplary embodiment, the first upper opening OOP1-1 may include the edge S3 parallel with the upper border U1 of the display area DA. However, hereinafter, for convenience of description, a case when the first upper opening OOP1-1 includes the edge S3 parallel with the upper border U1 of the display area DA is described in detail.

A plurality of first upper openings OOP1-1 may be arranged to be adjacent to the non-display area NDA and apart from each other. In an exemplary embodiment, the first upper openings OOP1-1 may be arranged to be parallel with the upper border U1 of the display area DA and apart from each other, for example. In another exemplary embodiment, the first upper openings OOP1-1 may be arranged to be adjacent to the non-display area NDA, parallel with the second direction, and apart from each other.

Similarly to the first upper opening OOP1-1, the first right opening OOP1-2 may also include an edge parallel with a border of the display area DA. Particularly, the first right opening OOP1-2 may include the edge S4 parallel with the right border U2 of the display area DA. A plurality of first right openings OOP1-2 may be arranged to be adjacent to the non-display area NDA and apart from each other. Particularly, the first right openings OOP1-2 may be arranged to be adjacent to the non-display area NDA, parallel with the right border U2 of the display area DA, and apart from each other.

In an exemplary embodiment, a first crossing opening OOP1-3 may be defined in the display apparatus 20. The first crossing opening OOP1-3 may include at least two edges parallel with a border of the display area DA. In an exemplary embodiment, the first crossing opening OOP1-3 may include an edge parallel with the second direction and an edge parallel with the first direction, for example. In another exemplary embodiment, the first crossing opening OOP1-3 may include the edge S3 parallel with the upper border U1 of the display area DA and the edge S4 parallel with the right border U2 of the display area DA.

The first internal opening IOP1 may be arranged in the display area DA. In an exemplary embodiment, the first internal opening IOP1 may not be the first adjacent opening OOP1 but the first opening OP1. In another exemplary embodiment, the first adjacent opening OOP1 may be arranged to surround the first internal opening IOP1.

The first adjacent opening OOP1 and the first internal opening IOP1, each defining an area of the first sub-pixels F1 implementing a same color, may have different shapes in a plan view. Particularly, the first upper opening OOP1-1, the first right opening OOP1-2, and the first crossing opening OOP1-3 may have shapes different from a shape of the first internal opening IOP1. In an exemplary embodiment, the first upper opening OOP1-1 and the first right opening OOP1-2 may have pentagonal shapes in a plan view, for example. Since the first internal opening IOP1 has a square shape in a plan view, the first upper opening OOP1-1, the first right opening OOP1-2, and the first internal opening IOP1 may have different shapes in a plan view. In another exemplary embodiment, the first crossing opening OOP1-3 may have a hexagonal shape in a plan view. Since the first internal opening IOP1 may have a square shape in a plan view, the first internal opening IOP1 may have a shape different from a shape of the first crossing opening OOP1-3 in a plan view.

Although not illustrated in the drawing, similarly to the first opening OP1, the second opening OP2 may include a second adjacent opening and a second internal opening. Similarly to the first adjacent opening OOP1, the second adjacent opening may be arranged in the display area DA to be adjacent to the non-display area NDA. Similarly to the first upper opening OOP1-1, the second adjacent opening may include an edge parallel with a lower border of the display area DA. A plurality of second adjacent openings may be arranged to be adjacent to the non-display area NDA and apart from each other. Similarly to the first internal opening IOP1, the second internal opening may be arranged in the display area DA.

Similarly to the first opening OP1 or the second opening OP2, a third opening OP3 may include a third adjacent opening OOP3 and a third internal opening IOP3. Similarly to the first adjacent opening OOP1, the third adjacent opening OOP3 may be arranged in the display area DA to be adjacent to the non-display area NDA. Similarly to the first upper opening OOP1-1 or the first right opening OOP1-2, the third adjacent opening OOP3 may include an edge parallel with the left border U3 or a lower border of the display area DA. A plurality of third adjacent opening OOP3 may be arranged to be adjacent to the non-display area NDA and apart from each other. Similarly to the first internal opening IOP1, the third internal opening IOP3 may be arranged in the display area DA.

In the above-described case, when a user views the display apparatus 20, light blur caused by sub-pixels in the display area DA adjacent to the non-display area NDA may be removed.

Figure 5A:
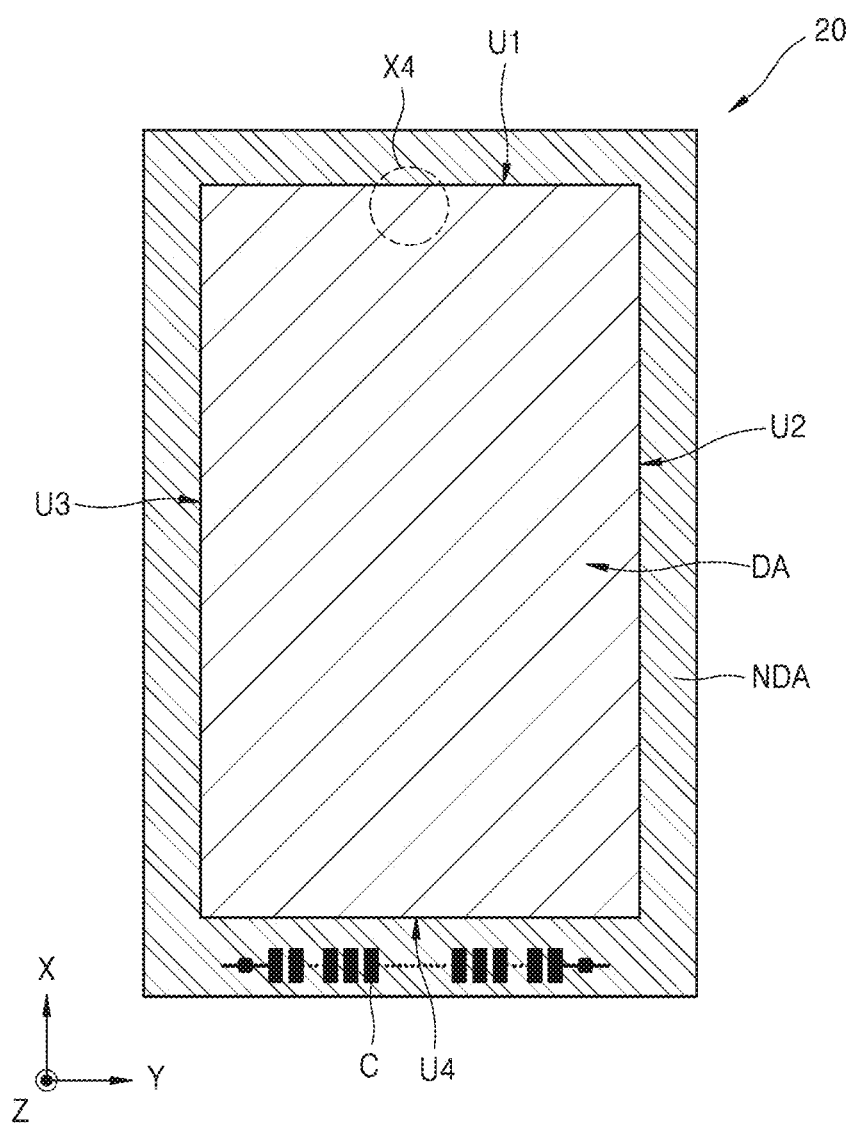
FIG. 5A is a plan view of a display apparatus according to a comparative example for comparison with an exemplary embodiment.
Figure 5B:
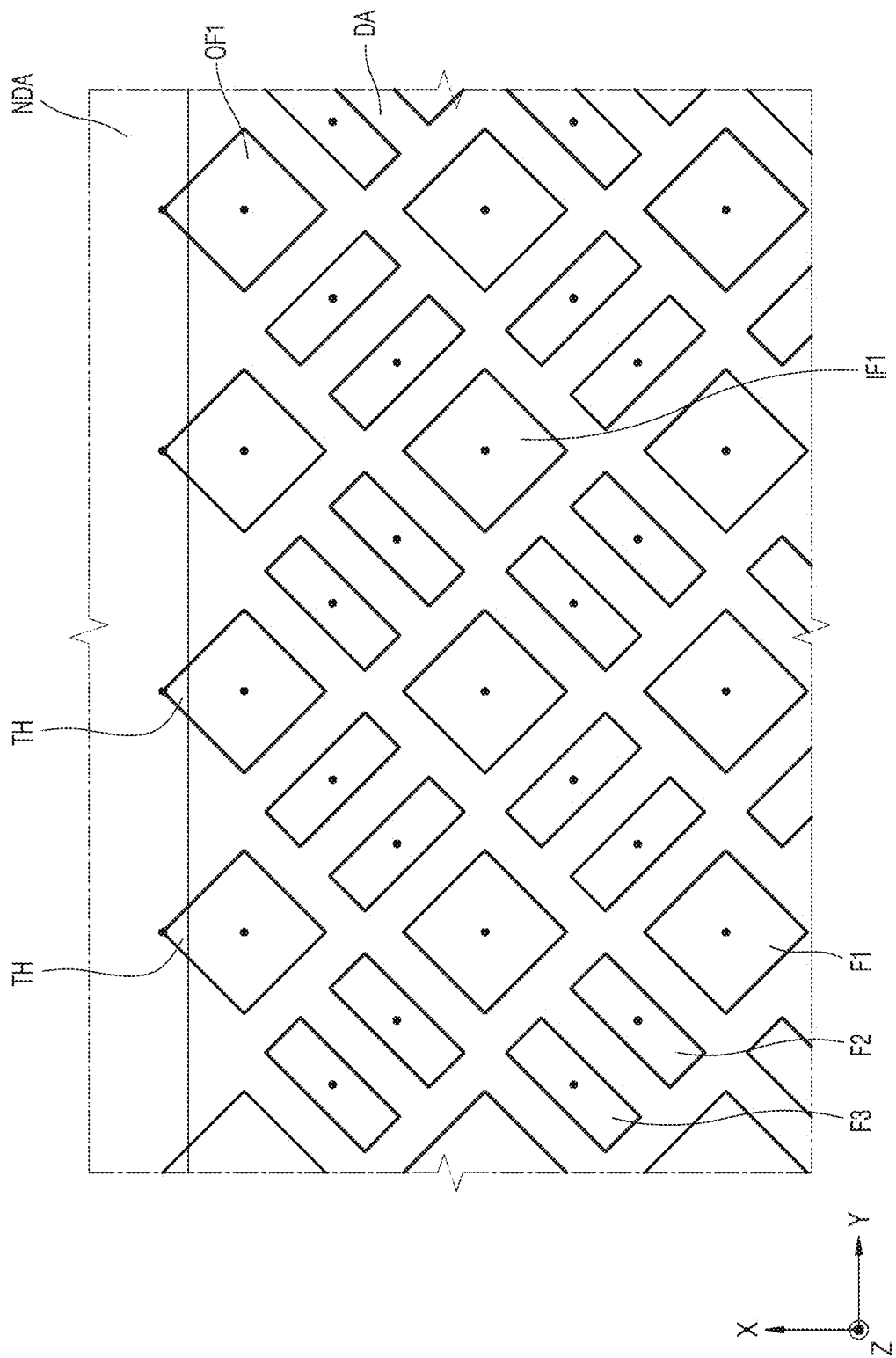
FIG. 5B is a magnified view of portion X4 of FIG. 5A.

As shown in FIGS. 5A and 5B, when sub-pixels F are tilted, the first adjacent sub-pixels OF1 and the first internal sub-pixels IF1 may be arranged to have a same shape in a plan view. In this case, the display area DA may be arranged alternately with the non-display area NDA to have a sawtooth shape TH.

Referring to FIGS. 5A and 5B, the upper border U1 and the right border U2 of the display area DA may overlap the first adjacent sub-pixel OF1. The left border U3 of the display area DA may overlap the third adjacent sub-pixel OF3. The lower border U4 of the display area DA may overlap at least one of the second adjacent sub-pixel and the third adjacent sub-pixel OF3. At the upper border U1 of the display area DA and the right border U2 of the display area DA, blue light may be emitted due to the first adjacent sub-pixel OF1. At the left border U3 of the display area DA, red light may be emitted due to the third adjacent sub-pixel OF3. At the lower border U4 of the display area DA, at least one selected form red light, yellow light, or green light may be emitted due to the second adjacent sub-pixel or the third adjacent sub-pixel OF3.

To minimize such a phenomenon, in the illustrated exemplary embodiment, an adjacent sub-pixel and an internal sub-pixel implementing a same color may have different shapes in a plan view. In addition, an adjacent opening and an internal opening, each defining an area of the sub-pixels F implementing a same color, may have different shapes in a plan view. As the shape of the adjacent sub-pixels OF in the display area DA adjacent to the non-display area NDA is different from the shape of an internal sub-pixel in a plan view, light blur may be removed.

Figure 6:
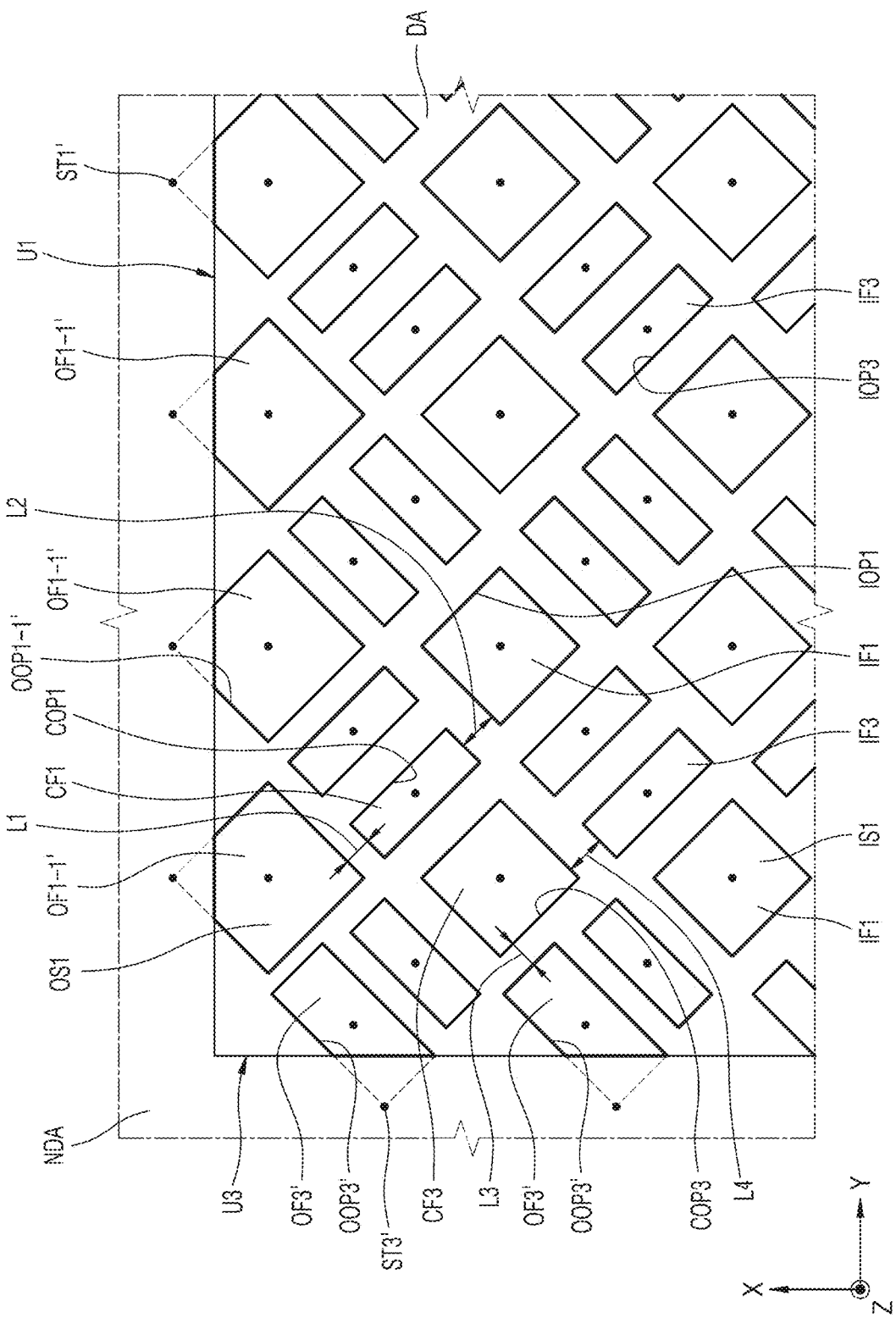
FIG. 6 is a plan view of an exemplary embodiment of a sub-pixel.

FIG. 6 is a plan view of another exemplary embodiment of a sub-pixel. In FIG. 6, like reference numerals in FIGS. 3 and 4B denote like elements, and thus their description will be omitted.

Referring to FIG. 6, a first upper sub-pixel OF1-1' may have a same size as that of the first internal sub-pixel IF1 in a plan view. In an exemplary embodiment, a size OS1 of the first upper sub-pixel OF1-1' may be identical to a size IS1 of the first internal sub-pixel IF1. In another exemplary embodiment, the first right sub-pixel may have a same size as that of the first internal sub-pixel IF1. In another exemplary embodiment, the first crossing sub-pixel may have a same size as that of the first internal sub-pixel IF1. Hereinafter, for convenience of description, a case when the size OS1 of the first upper sub-pixel OF1-1' is identical to the size IS1 of the first internal sub-pixel IF1 is described in detail.

In an exemplary embodiment, a first central sub-pixel CF1 arranged to be adjacent to and face the first upper sub-pixel OF1-1' and the first internal sub-pixel IF1, respectively, may be included. A shortest distance L1 from a border of the first upper sub-pixel OF1-1' to a border of the first central sub-pixel CF1 may be different from a shortest distance L2 from a border of the first internal sub-pixel IF1 to a border of the first central sub-pixel CF1. Particularly, the shortest distance L1 from the border of the first upper sub-pixel OF1-1' to the border of the first central sub-pixel CF1 may be less than the shortest distance L2 from the border of the first internal sub-pixel IF1 to the border of the first central sub-pixel CF1.

Similarly to the above description, the second adjacent sub-pixel may have a same size as that of the second internal sub-pixel in a plan view. In addition, a second central sub-pixel arranged to be adjacent to and face the second adjacent sub-pixel and the second internal sub-pixel, respectively, may be included. A shortest distance from a border of the second adjacent sub-pixel to a border of the second central sub-pixel may be different from a shortest distance from a border of the second internal sub-pixel to a border of the second central sub-pixel. Particularly, the shortest distance from the border of the second adjacent sub-pixel to the border of the second central sub-pixel may be less than the shortest distance from the border of the second internal sub-pixel to the border of the second central sub-pixel.

The third adjacent sub-pixel OF3' may have a same size as that of the third internal sub-pixel IF3 in a plan view. In addition, the third central sub-pixel CF3 arranged to be adjacent to and face the third adjacent sub-pixel OF3' and the third internal sub-pixel IF3, respectively, may be included. A shortest distance L3 from a border of the third adjacent sub-pixel OF3' to a border of the third central sub-pixel CF3 may be different from a shortest distance L4 from a border of the third internal sub-pixel IF3 to a border of the third central sub-pixel CF3. Particularly, the shortest distance L3 from the border of the third adjacent sub-pixel OF3' to the border of the third central sub-pixel CF3 may be less than the shortest distance L4 from the border of the third internal sub-pixel IF3 to the border of the third central sub-pixel CF3.

From another perspective, the first upper opening OOP1-1' may have a same size as that of the first internal opening IOP1 in a plan view. In an exemplary embodiment, the size OS1 of the first upper opening OOP1-1' may be identical to the size IS1 of the first internal opening IOP1. In another exemplary embodiment, the first right opening may have a same size as that of the first internal opening IOP1. In another exemplary embodiment, the first crossing opening may have a same size as that of the first internal opening IOP1. Hereinafter, for convenience of description, a case when the size OS1 of the first upper opening OOP1-1' is identical to the size IS1 of the first internal opening IOP1 is described in detail.

In an exemplary embodiment, a first central opening COP1 arranged to be adjacent to and face the first upper opening OOP1-1' and the first internal opening IOP1, respectively, may be defined. The shortest distance L1 from a border of the first upper opening OOP1-1' to a border of the first central opening COP1 may be different from the shortest distance L2 from a border of the first internal opening IOP1 to a border of the first central opening COP1. Particularly, the shortest distance L1 from the border of the first upper opening OOP1-1' to the border of the first central opening COP1 may be less from the shortest distance L2 from the border of the first internal opening IOP1 to the border of the first central opening COP1.

Similarly to the above description, the second adjacent opening may have a same size as that of the second internal opening in a plan view. In addition, a second central opening arranged to be adjacent to and face the second adjacent opening and the second internal opening, respectively, may be defined. A shortest distance from a border of the second adjacent opening to a border of the second central opening may be different from a shortest distance from a border of the second internal opening to a border of the second central opening. Particularly, the shortest distance from the border of the second adjacent opening to the border of the second central opening may be less than the shortest distance from the border of the second internal opening to the border of the second central opening.

The third adjacent opening OOP3' may have a same size as that of the third internal opening IOP3 in a plan view. In addition, the third central opening COP3 arranged to be adjacent to and face the third adjacent opening OOP3' and the third internal opening IOP3, respectively, may be defined. The shortest distance L3 from a border of the third adjacent opening OOP3' to a border of the third central opening COP3 may be different from the shortest distance L4 from a border of the third internal opening IOP3 to a border of the third central opening COP3. Particularly, the shortest distance L3 from the border of the third adjacent opening OOP3' to the border of the third central opening COP3 may be less than the shortest distance L4 from the border of the third internal opening IOP3 to the border of the third central opening COP3. A first apex ST1' and a third apex ST3' may be substantially similar to the first apex ST1 and the third apex ST3 shown in FIG. 4B described above.

As described above, when the adjacent sub-pixel has a same size as that of the internal sub-pixel in a plan view, light may be uniformly emitted in the display area DA adjacent to the non-display area NDA. Accordingly, a possibility of a difference in brightness or a color that may be caused by non-uniform light emission may be reduced.

Figure 7:
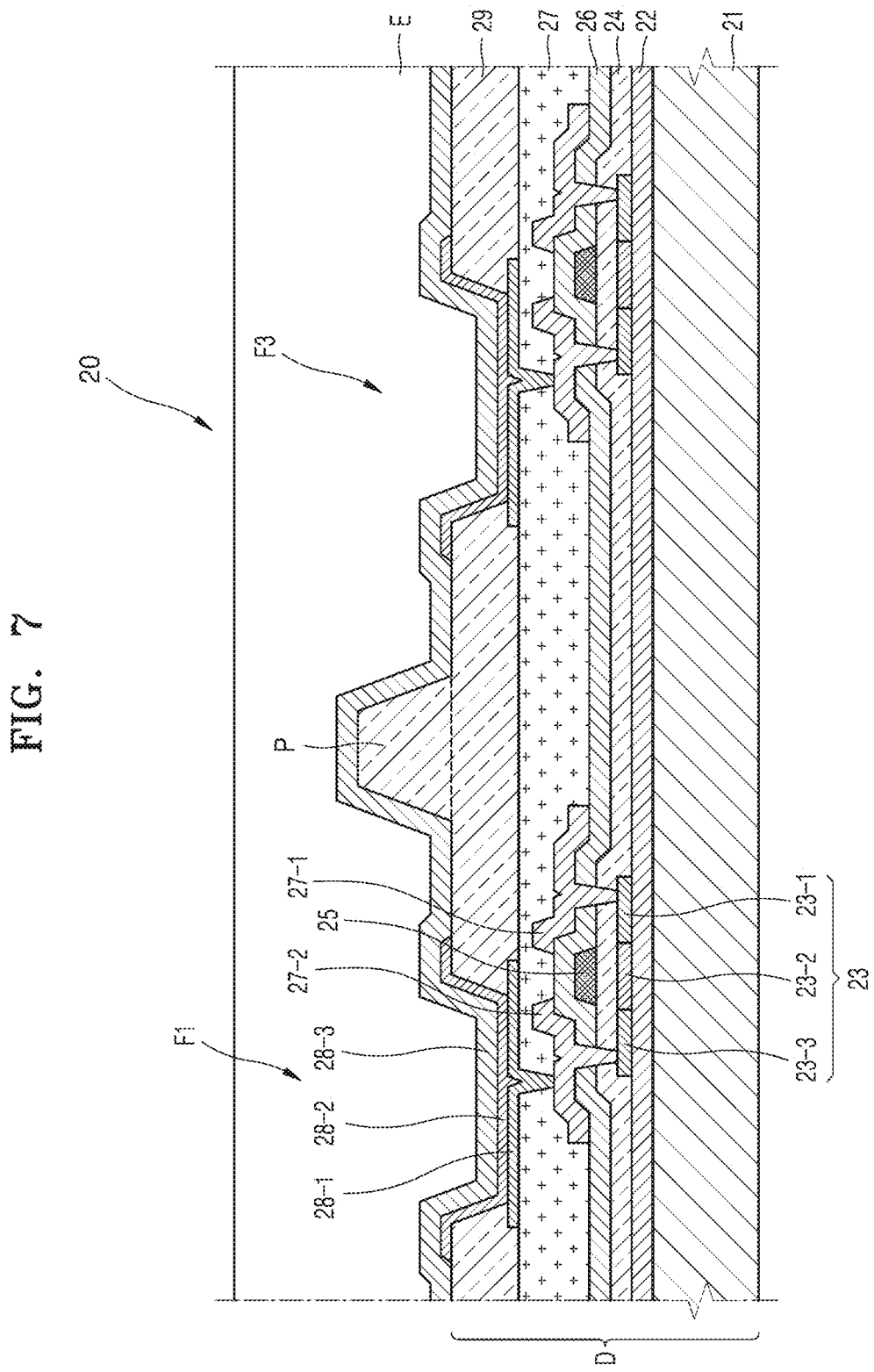
FIG. 7 is a cross-sectional view of another exemplary embodiment of a display apparatus.

FIG. 7 is a cross-sectional view of another exemplary embodiment of a display apparatus. In FIG. 7, like reference numerals in FIG. 3 denote like elements, and thus their description will be omitted.

Referring to FIG. 7, a spacer P may be arranged between respective sub-pixels. The spacer P may be arranged on the pixel-defining layer 29 or be unitary with the pixel-defining layer 29. The spacer P may include a material identical to or different from the pixel-defining layer 29.

The spacer P may have various forms. In an exemplary embodiment, a plurality of spacers P may be included to have a projection form, and the plurality of spacers P may be arranged on the pixel-defining layer 29 to apart from each other, for example. In another exemplary embodiment, one spacer P may be provided in a space between sub-pixels adjacent to each other. However, the spacer P is not limited thereto.

The spacer P may be provided to prevent damage of the substrate 21 in a method of manufacturing the display apparatus 20 in the invention. In the method of manufacturing the display apparatus 20, a mask sheet may be used. As the mask sheet is introduced into an opening of the pixel-defining layer 29 or is adhered to the pixel-defining layer 29, when a deposition material is deposited on the substrate 21, a dent defect caused when each mask assembly damages or breaks a portion of the substrate 21 may occur. When each of mask assemblies is adhered to the substrate 21, the spacer P may be used to maintain a space between an end of an opening area of the pixel-defining layer 29 and each of the mask assemblies.

According to various exemplary embodiments, when a display apparatus is arranged in a vehicle, etc., external light reflection may be minimized and light blur may be removed in the display apparatus.

It should be understood that exemplary embodiments described herein should be considered in a descriptive sense only and not for purposes of limitation. Descriptions of features within each exemplary embodiment should typically be considered as available for other similar features in other exemplary embodiments. While one or more exemplary embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
   a display area and a non-display area;
   a sub-pixel in the display area; and
   a pixel-defining layer which defines an area of the sub-pixel, the sub-pixel comprising:
      an adjacent sub-pixel arranged in the display area to be adjacent to the non-display area; and
      an internal sub-pixel arranged in the display area,
   wherein
   the adjacent sub-pixel and the internal sub-pixel implement a same color and have different shapes in a plan view,
   the sub-pixel comprises a first sub-pixel, a second sub-pixel, and a third sub-pixel,
   the first sub-pixel, the second sub-pixel, and the third sub-pixel emit light of different colors,
   the first sub-pixel has a square shape,
   the second sub-pixel is arranged to face a first side and a second side of the first sub-pixel, and
   the third sub-pixel is arranged to face the first side and the second side of the first sub-pixel and is apart from the second sub-pixel.

2. The display apparatus of claim 1, wherein the pixel-defining layer is arranged in the display area and the non-display area.

3. The display apparatus of claim 1, wherein, in the plan view, the first sub-pixel has a size greater than at least one of a size of the second sub-pixel and a size of the third sub-pixel.

4. The display apparatus of claim 1, wherein the sub-pixel further comprises a plurality of first sub-pixels,
wherein the plurality of first sub-pixels is arranged in a first direction, and
a long side of the second sub-pixel or a long side of the third sub-pixel defines an angle of about 45 degrees with respect to an arbitrary line connecting centers of the plurality of first sub-pixels arranged in the first direction.

5. The display apparatus of claim 1, further comprising a spacer protruding from the pixel-defining layer.

6. The display apparatus of claim 2, wherein the pixel-defining layer comprises a black material or a material with an optical density of 1.

7. A display apparatus comprising:
a display area and a non-display area;
a sub-pixel in the display area, and
a pixel-defining layer in which defines an area of the sub-pixel, the sub-pixel comprising,
an adjacent sub-pixel arranged in the display area to be adjacent to the non-display area; and
an internal sub-pixel arranged in the display area,
wherein
the adjacent sub-pixel and the internal sub-pixel implement a same color and have different shapes in a plan view, and,
in the plan view, the adjacent sub-pixel has a same size as a size of the internal sub-pixel.

8. The display apparatus of claim 1, wherein, in the plan view, the adjacent sub-pixel has a same size as a size of the internal sub-pixel,
the adjacent sub-pixel and the internal sub-pixel are respectively arranged to be adjacent to and face a same central sub-pixel, and
a shortest distance from a border of the adjacent sub-pixel to a border of the central sub-pixel is different from a shortest distance from a border of the internal sub-pixel and a border of the central sub-pixel.

9. A display apparatus comprising:
a display area and a non-display area;
a plurality of sub-pixels in the display area; and
a pixel-defining layer in which a plurality of openings defines areas of the plurality of sub-pixels,
wherein the plurality of openings is adjacent to the non-display area and comprises an adjacent opening in the display area and an internal opening in the display area,
the adjacent opening and the internal opening, each defining an area of the plurality of sub-pixels implementing a same color, have different shapes in a plan view,
the plurality of openings comprises a first opening, a second opening, and a third opening,
the first opening has a square shape,
the second opening is arranged to face both a first side and a second side of the first opening, and
the third opening is arranged to face both the first side and the second side of the first opening, and is apart from the second opening.

10. The display apparatus of claim 9, wherein the pixel-defining layer is arranged in the display area and the non-display area.

11. The display apparatus of claim 9, wherein the plurality of openings further comprises a plurality of first openings,
wherein the plurality of first openings is arranged in a first direction, and
a long side of the second opening or a long side of the third opening defines an angle of about 45 degrees with respect to an arbitrary line connecting centers of the plurality of first openings arranged in the first direction.

12. The display apparatus of claim 9, wherein the first opening has a size greater than at least one of a size of the second opening and a size of the third opening.

13. The display apparatus of claim 9, wherein the pixel-defining layer comprises a black material or a material with an optical density of 1.

14. The display apparatus of claim 9, further comprising a spacer protruding from the pixel-defining layer.

15. A display apparatus comprising,
a display area and a non-display area;
a plurality of sub-pixels in the display area; and
a pixel-defining layer in which a plurality of openings defines areas of the plurality of sub-pixels,
wherein
the plurality of openings comprises and adjacent opening in the display area to be adjacent to the non-display area and an internal opening in the display area,
the adjacent opening and the internal opening, each defining an area of the plurality of sub-pixels implementing a same color, have different shapes in a plan view, and
in the plan view, the adjacent opening has a same size as a size of the internal opening.

16. The display apparatus of claim 9, wherein, in the plan view, the adjacent opening has a same size as a size of the internal opening,
the adjacent opening and the internal opening are respectively arranged to be adjacent to and face a same central opening, and
a shortest distance from a border of the adjacent opening to a border of the central opening is different from a shortest distance from a border of the internal opening to a border of the central opening.

17. The display apparatus of claim 16, wherein a shortest distance from the border of the adjacent opening to the border of the central opening is less than a shortest distance from the border of the internal opening to the border of the central opening.

* * * * *